United States Patent
Kiriaki

[11] Patent Number: 5,838,270
[45] Date of Patent: Nov. 17, 1998

[54] SECOND ORDER AND CASCADED 2-1 OVERSAMPLED MODULATORS WITH IMPROVED DYNAMIC RANGE

[75] Inventor: Sami Kiriaki, Garland, Tex.

[73] Assignee: Texas Instruments Incorporated, Dallas, Tex.

[21] Appl. No.: 371,635

[22] Filed: Jan. 12, 1995

[51] Int. Cl.$^6$ ............................................. H03M 3/00
[52] U.S. Cl. ........................................... 341/143; 333/173
[58] Field of Search .............................. 341/143; 333/173

[56] References Cited

U.S. PATENT DOCUMENTS

| | | | |
|---|---|---|---|
| 5,055,843 | 10/1991 | Ferguson, Jr. et al. | 341/143 |
| 5,311,181 | 5/1994 | Ferguson, Jr. et al. | 341/143 |
| 5,392,042 | 2/1995 | Pellon | 341/143 |
| 5,500,645 | 3/1996 | Ribner et al. | 341/143 |

OTHER PUBLICATIONS

Brandt et a.l., "A CMOS Oversampling A/D Converter with 12–Bit Resolution Rates above 1 MHZ," Sep. 25, 1990, pp. 1–5.
Candy et al., "Oversampling Methods for A/D and D/A Conversion," pp. 1–25, IEEE Press.
Ribner, "A Comparison of Modulator Networks for High–Order Oversampled ΣΔ Analog–to–Digital Converters," *IEEE Transactions on Circuits and Systems*, vol. 38, No. 2, Feb. 1991, pp. 145–159.

*Primary Examiner*—Howard L. Williams
*Attorney, Agent, or Firm*—W. James Brady, III; Richard L. Donaldson

[57] ABSTRACT

An oversampled modulator (FIGS. 1 and 4) for operation in a frequency band from DC to a finyite frequency having a transfer function containing a plurality of zeros, at least two of which are disposed in the frequency band at a location other than at DC. The transfer function can have a plurality of zeros in the frequency band at a location other than at DC and at the same frequency. The second order version of the oversampled modulator has the transfer function:

$$Y1(Z) = X(Z)\frac{(G1S2)Z^{-2}}{D(Z)} + Q(Z)\frac{(1 - 2Z^{-1} + (1 + S2K)Z^{-2})}{D(Z)}$$

where $$D(Z) = 1 + (A2-2)Z^{-1} + (1-A2+A1\ S2+K\ S2)Z^{-2},\ X(Z) =$$

input signal and Q(Z)=ADC quantization noise and the cascaded 2-1 embodiment has the transfer function:

$$Y(Z) = Y_1(Z)(1+(b_1-1)(1-Z^{-1})^2) - Y_2(Z)\ (1/g_2)(1-2Z^{-1}+(1+K)Z^{-2}).$$

The coefficient K is provided by a capacitor T-network. The value of K in the transfer functions can be programmable.

4 Claims, 3 Drawing Sheets

$$Y1(Z) = X(Z)\frac{(G1\ S2)\ Z^{-2}}{D(Z)} + Q(Z)\frac{(1 - 2Z^{-1} + (1+S2\ K)\ Z^{-2})}{D(Z)}$$

$$D(Z) = 1 + (A2-2)\ Z^{-1} + (1-A2+A1\ S2+K\ S2)\ Z^{-2}$$

IF : A1=1, G1=1, S2=1, A2=2.5

THEN : $Y1(Z) = X(Z)\dfrac{Z^{-2}}{1+0.5Z^{-1}+(K-0.5)\ Z^{-2}} + Q(Z)\dfrac{(1-2Z^{-1}+(1+K)\ Z^{-2})}{1+0.5Z^{-1}+(K-0.5)\ Z^{-2}}$

IF : A1=1, G1=1, S2=1, A2=2

THEN : $Y1(Z) = X(Z)\dfrac{Z^{-2}}{1+K\ Z^{-2}} + Q(Z)\dfrac{(1-2Z^{-1}+(1+K)\ Z^{-2})}{1+K\ Z^{-2}}$

NEW SECOND ORDER MODULATOR $$Y1(Z) = X(Z) \frac{(G1\ S2)\ Z^{-2}}{D(Z)} + Q(Z) \frac{(1-2Z^{-1}+(1+S2\ K)\ Z^{-2})}{D(Z)}$$

$$D(Z) = 1 + (A2-2)\ Z^{-1} + (1-A2+A1\ S2+K\ S2)\ Z^{-2}$$

IF : A1=1, G1=1, S2=1, A2=2.5

THEN : $Y1(Z) = X(Z) \dfrac{Z^{-2}}{1+0.5Z^{-1}+(K-0.5)\ Z^{-2}} + Q(Z) \dfrac{(1-2Z^{-1}+(1+K)\ Z^{-2})}{1+0.5Z^{-1}+(K-0.5)\ Z^{-2}}$

IF : A1=1, G1=1, S2=1, A2=2

THEN : $Y1(Z) = X(Z) \dfrac{Z^{-2}}{1+K\ Z^{-2}} + Q(Z) \dfrac{(1-2Z^{-1}+(1+K)\ Z^{-2})}{1+K\ Z^{-2}}$

NEW SECOND ORDER MODULATOR

SWIT. CAP. MODULATOR REALIZATION

SECOND ORDER AND CASCADED 2-1 OVERSAMPLED MODULATORS WITH IMPROVED DYNAMIC RANGE

BACKGROUND OF THE INVENTION

1. Field of the Invention

This invention relates to oversampled modulators and, more specifically, to a system for optimizing the location of zeros of the quantization noise transfer function in oversampled modulators to minimize the total inband quantization noise.

2. Brief Description of the Prior Art

Oversampled modulators used for digital to analog converters (DAC) or analog to digital converters (ADC) are normally referred to as sigma-delta or delta-sigma modulators. Examples of such converters are referenced in "Oversampling Methods for A/D and D/A Conversion" by James C. Candy and Gabor C. Temes, *Oversampling Delta-Sigma Data Converters*, Edited by James C. Candy and Gabor C. Temes, IEEE Press, ISBN 0-87942-285-8 and "A CMOS Oversampling A/D Converter with 12-Bit Resolution at Conversion Rates Above 1 MHz" by Brian P. Brandt and Bruce A Wooley, Center for Integrated Systems, Stanford University, Sep. 25, 1990 which are incorporated herein by reference. Oversampling refers to a sampling rate or frequency which is greater than the Nyquist rate. Typically, the ratio of the oversampling rate to the Nyquist rate is referred to as the oversampling ratio (OSR). In the case of an oversampled modulator, the output thereof is being sampled at a rate greater than the Nyquist rate with typical oversampling ratios being, for example, 32, 64, 128, 256, etc, the power of two ratio being convenient but not necessary.

A typical ADC has an analog input and provides a digital output at a rate $F_s$ which is the sampling rate and is generally twice the Nyquist rate. Typically, in the case of an oversampled modulator, an analog input signal is provided and sampled at a sampling rate which will be referred to as $f_s$. The sampled signals are sent to an oversampled modulator which produces digital words at the rate of $f_s$ also. The oversampled modulator is essentially an ADC and provides one or more bits at the rate $F_s*OSR=f_s$ to a decimator which is a digital filter and which divides the sampling ratio by OSR to provide the original sampling rate of $F_s$.

The resolution available with prior art Nyquist type A/D converters without calibration is from about 8 to about 12 bits. To provide better than about 12 bits resolution requires additional calibration, meaning additional hardware, this being generally prohibitively expensive. Oversampled ADCs permit dynamic range to as many as about 18 bits to 20 bits without components calibration or trimming. This is generally accomplished by shaping the quantization noise in the frequency domain when passing through the modulator. The noise can also be reduced in the digital filter by the addition of coefficients of the finite impulse response (FIR) filters therein whereby the bandwidth of the output of the oversampled modulator is reduced. This eliminates a great deal of the out of band noise provided by the modulator. The ratio of signal to in band noise, however, is quite large.

A typical DAC has a digital input at a rate $F_s$ which is twice the Nyquist rate and provides an analog output. Typically, in the case of an oversampled modulator, the digital input stream at a rate of $F_s$ is passed through a digital filter called an interpolator that serves the function of interpolating between incoming digital samples and provides a higher data rate. Typically, this data rate is $F_s*OSR$. The higher data rate interpolator output is passed through a digital modulator which, in turn, outputs one or more digital bits and serves the function of noise shaping in the frequency domain. The digital modulator output is then passed to analog DAC and analog filtering to filter out the high frequency noise.

SUMMARY OF THE INVENTION

In accordance with the present invention, the in band noise is materially reduced, especially in second order and cascaded 2-1 oversampled modulators. This is accomplished by optimizing the location of zeros of the noise transfer function to minimize the total in band quantization noise. Whereas prior art solutions used non-optimum zero location with all zeros at DC, the improvement herein provides a manner of optimally locating zeros with all zeros not being located at DC.

Briefly, there is provided a feedback coefficient between the output of the second integrator and the input of the first integrator in typical second order oversampled modulators and typical second order portions of a cascaded oversampled modulator.

The transfer function for the second order oversampled modulator circuit of FIG. 1 is:

$$Y1(Z) = X(Z)\frac{(G1S2)Z^{-2}}{D(Z)} + Q(Z)\frac{(1-2Z^{-1}+(1+S2K)Z^{-2})}{D(Z)}$$

where $$D(Z)=1+(A2-2)Z^{-1}+(1-A2+A1\ S2+K\ S2)Z^{-2}$$

Referring to the transfer function, it contains two components, these being the signal transfer function $Y_1(Z)/X(Z)$ and the quantization noise transfer function $Y_1(Z)/Q(Z)$ added together. The signal transfer function is the first term of the transfer function equation wherein $X(Z)$ is the signal input, $(G1\ S2)$ are feed forward multipliers, $Z^{-2}$ is a two clock cycle delay and $D(Z)$ contains feedback $A1$, $A2$ and feedback $K$. The quantization noise transfer function is the second term of the transfer function equation wherein $Q(Z)$ is the residual error of the quantizer as shown in FIG. 1 and is often called quantization noise. The numerator is a second order polynomial containing both feedback K and feed forward $S_2$. If K is zero, the transfer function reverts to two zeros, both located at DC. The quantization noise transfer function has two complex conjugate zeros wherein the frequency is determined by K, the feedback coefficient, only since $S_2$ is fixed by the signal transfer function. In the prior art, the value of K is zero because there is no such feedback.

The transfer function for the 2-1 cascaded oversampled modulator circuit of FIG. 4 is:

$$Y(Z)=Y_1(Z)(1+(b_1-1)(1-Z^{-1})^2)-Y_2(Z)(1/g_2)(1-2Z^{-1}+(1+K)Z^{-2}).$$

Prior art architectures for 2-1 cascaded oversampled modulators have had three zeros at DC or frequency zero. By providing the feedback K across the second order portion of the oversampled modulator as discussed above, there is provided a capability of locating two complex conjugate zeros by changing the value of K while maintaining one zero only at DC.

One practical way to implement the coefficient K in either of the above transfer functions in the case of implementing an ADC system is to use a switched capacitor network with switched capacitor implementation of the second order oversampled modulator. Due to the small ratio of K, requiring fractional units, a T-capacitor network can be used to achieve small fractional unit size. The problem with this approach is the parasitic capacitance added at the junction of the three capacitors of the T-capacitor network which causes fluctuation in the value of K, especially with uncontrolled parasitic capacitance value. However, even with reasonably expected fluctuations, good signal to noise ratio gains can still be achieved with this type of implementation.

DESCRIPTION OF THE PREFERRED EMBODIMENT

Figure 1:
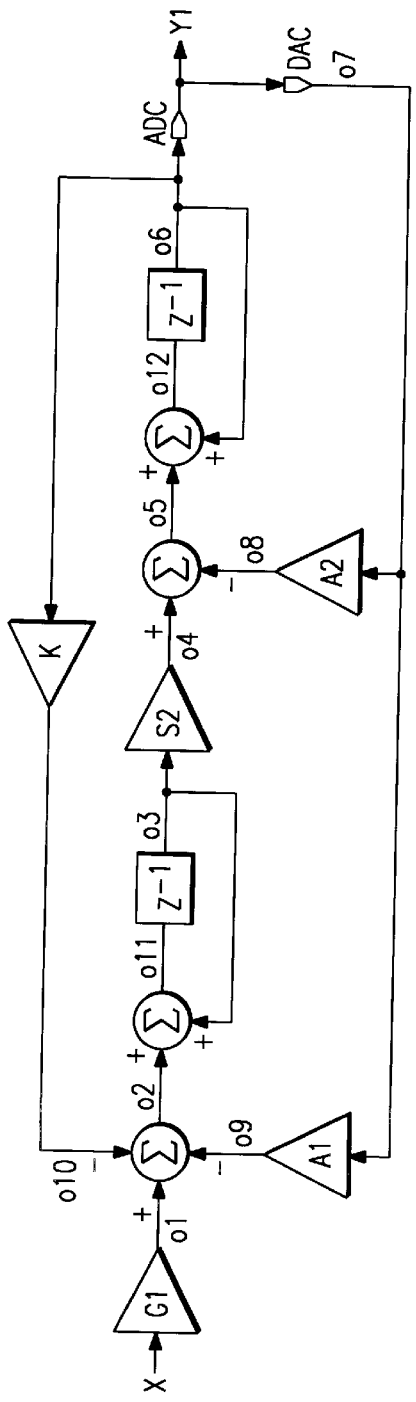
FIG. 1 is a circuit diagram in accordance with the transfer function for a second order oversampled modulator as set forth hereinabove of a second order oversampled modulator in accordance with the present invention.

Referring to FIG. 1, there is shown a second order modulator in accordance with the present invention. With the exception of the feedback coefficient K from the output of the second integrator to the summing circuit at the input of the first integrator, the modulator is the same as in the prior art.

The modulator of FIG. 1 includes two components, these being the signal transfer function $Y_1(Z)/X(Z)=(G1\ S2)\ Z^{-2}/D(Z)$ and the quantization noise transfer function $Y_1(Z)/Q(Z)=(1-2Z^{-1}+(1+S2\ K)\ Z^{-2})/D(Z)$. The signal transfer function is composed of $G_1$ and $S_2$, which are feed forwards, and $Z^{-2}$ is a delay of two clock cycles represented by the two blocks $Z^{-1}$. This is divided by $D(Z)$ which is composed of feed forward $S_2$ and feedback $A2$, $A_1$ and K. The quantization noise transfer function is composed of a numerator that determines the location of two zeros by the feedback parameter K and denominator $D(Z)$ similar to the signal transfer function.

The performance of the modulator is improved by the addition of the feedback noted as "K" which provides control over the two zeros in the transfer function of the second order modulator as can be seen from the quantization noise transfer function for this circuit as set forth above. The zero can be moved by the use of different "K" coefficients. Changing of the location of the zero changes the dynamic range or the performance of the modulator.

Figure 2:
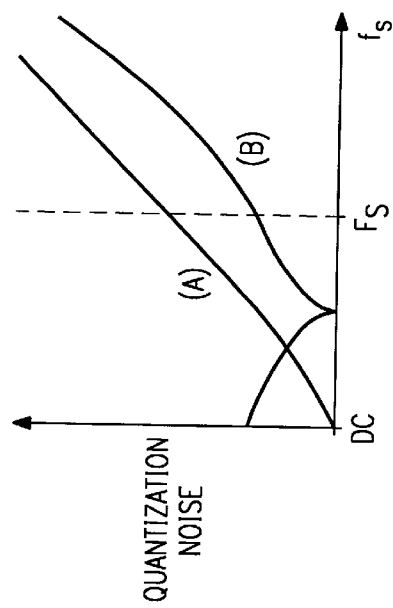
FIG. 2 is a graph of noise as a function of sample rate for an oversampled modulator.

When viewing the graph A of FIG. 2 which plots noise as a function of sampling rate, $f_s$, it can be seen that the noise increases in the direction from DC to $f_s$. This is typically caused by the fact that the modulator quantization noise transfer function has zeros at DC. If the zeros are shifted from DC to some region between DC and the end of the pass band, as shown in graph B of FIG. 2, the noise will increase from the zero in both direction, however the total integrated in-band noise can be less than the total integrated in-band noise when zeros are at DC, depending upon the actual zeros placements as shown in FIG. 2 It follows that the zero for the modulator can be adjusted to any point within the pass band by adjusting the transfer function of the modulator, this merely requiring an adjustment of K, to provide the appropriate zero for minimum in band noise.

Figure 3:
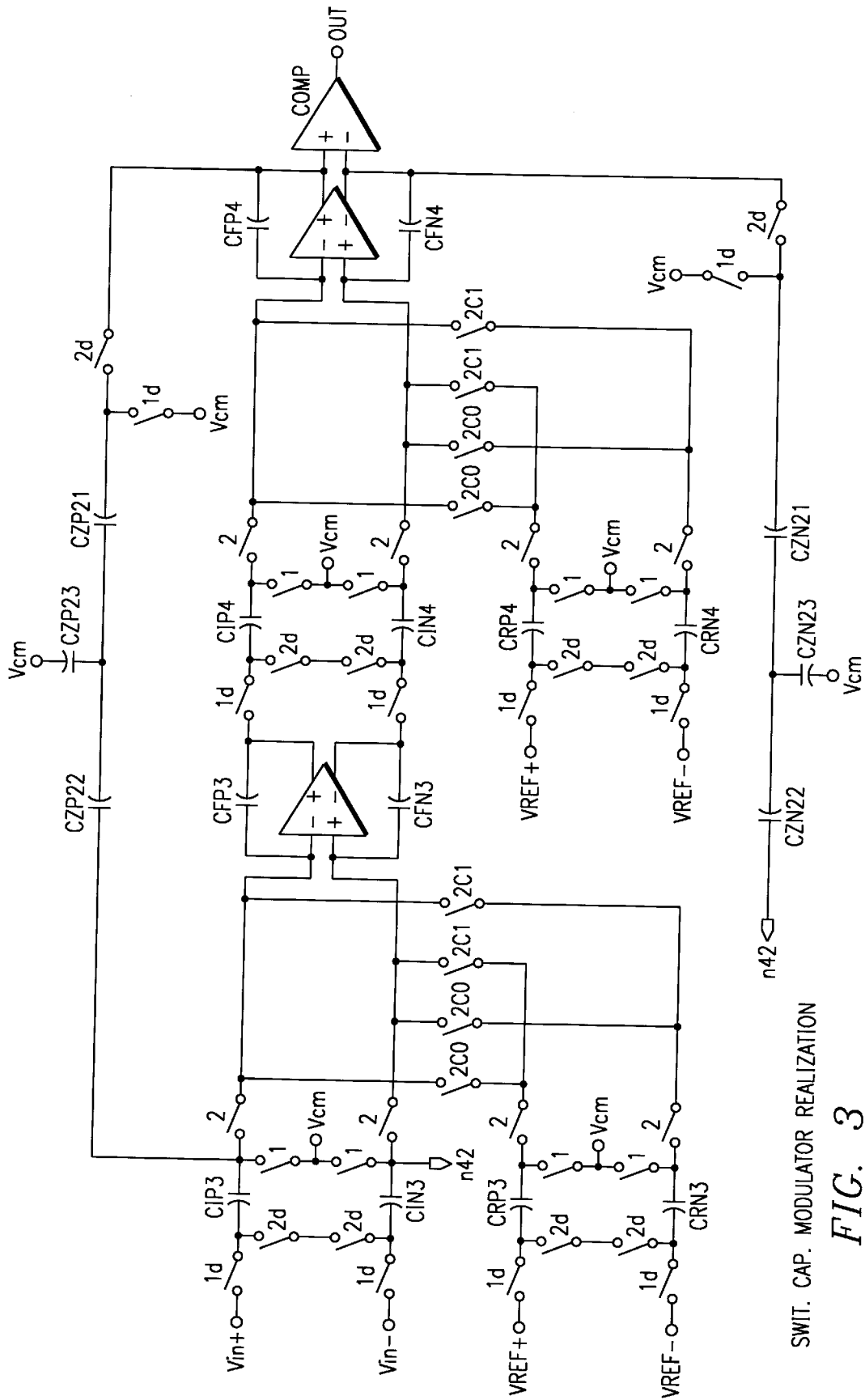
FIG. 3 is a circuit diagram showing actual electronic components of an oversampled modulator used to build an ADC system in accordance with the transfer function set forth in FIG. 1.

FIG. 3 is a circuit diagram of an oversampled modulator implementing an ADC system according to the transfer function depicted in FIG. 1 but showing the circuit using standard hardware rather than the representation of the standard hardware as in FIG. 1.

Figure 4:
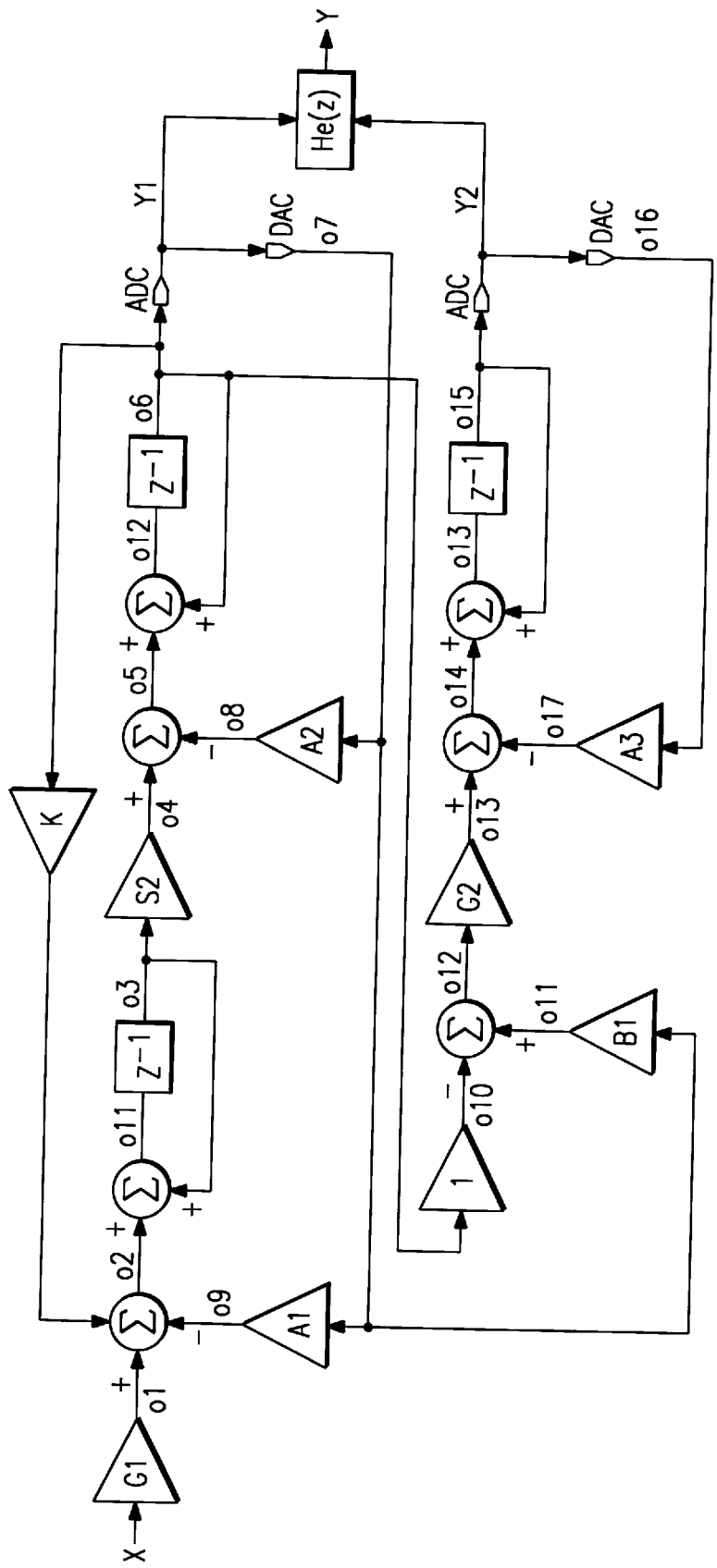
FIG. 4 is a circuit diagram in accordance with the transfer function for a cascaded 2-1 oversampled modulator as set forth hereinabove of a cascaded 2-1 oversampled modulator in accordance with the present invention.

FIG. 4 is a cascaded 2-1 oversampled modulator in accordance with the present invention. With the exception of the feedback coefficient K from the output of the second integrator to the summing circuit at the input of the first integrator, the modulator is the same as in the prior art. However, the output of the first stage modulator and second stage modulator must be combined as shown in the equation of FIG. 4 in order to achieve proper operation.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

I claim:

1. An oversampled modulator for operation in a frequency band from DC to a finite frequency, said modulator having the transfer function:

$$Y1(Z) = X(Z)\frac{(G1S2)\ Z^{-2}}{D(Z)} + Q(Z)\frac{(1-2Z^{-1}+(1+S2K)Z^{-2})}{D(Z)}$$

where $D(Z)=1+(A2-2)Z^{-1}+(1-A2+A1\ S2+K\ S2)Z^{-2}$ $X(Z)$=input signal $Q(Z)$=ADC quantization noise;

said transfer function containing a plurality of zeros, at least one of said zeros being disposed in said frequency band at a location other than at DC.

2. The oversampled modulator of claim 1 wherein said coefficient K is provided by a capacitor T-network for an ADC implementation.

3. An oversampled modulator for operation in a frequency band from DC to a finite frequency, said modulator having the transfer function:

$$Y(Z)=Y_1(Z)(1+(b_1-1)(1-Z^{-1})^2)-Y_2(Z)(1/g_2)(1-2Z^{-1}+(1+K)Z^{-2});$$

said transfer function containing a plurality of zeros, at least one of said zeros being disposed in said frequency band at a location other than at DC.

4. The oversampled modulator of claim 3 wherein said coefficient K is provided by a capacitor T-network for an ADC implementation.

* * * * *